(12) United States Patent
Ajit

(10) Patent No.: US 6,930,528 B2
(45) Date of Patent: Aug. 16, 2005

(54) DELAY CIRCUIT AND METHOD WITH DELAY RELATIVELY INDEPENDENT OF PROCESS, VOLTAGE, AND TEMPERATURE VARIATIONS

(75) Inventor: Janardhanan S. Ajit, Irvine, CA (US)

(73) Assignee: Broadcom Corporation, Irvine, CA (US)

(*) Notice: Subject to any disclaimer, the term of this patent is extended or adjusted under 35 U.S.C. 154(b) by 0 days.

(21) Appl. No.: 10/938,956

(22) Filed: Sep. 13, 2004

(65) Prior Publication Data

US 2005/0030078 A1 Feb. 10, 2005

Related U.S. Application Data

(63) Continuation of application No. 10/661,563, filed on Sep. 15, 2003, now Pat. No. 6,815,995, which is a continuation of application No. 10/180,501, filed on Jun. 27, 2002, now Pat. No. 6,646,488.
(60) Provisional application No. 60/357,878, filed on Feb. 21, 2002.

(51) Int. Cl.[7] ............................................. H03H 11/26
(52) U.S. Cl. ...................................... 327/262; 327/112
(58) Field of Search ................................ 327/108, 112, 327/262, 263, 264, 270, 271, 276, 284; 326/82, 83, 84, 90, 95

(56) References Cited

U.S. PATENT DOCUMENTS

| | | | |
|---|---|---|---|
| 5,175,445 A | 12/1992 | Kinugasa et al. | 326/87 |
| 5,559,394 A * | 9/1996 | Wood | 315/224 |
| 5,767,728 A | 6/1998 | Michail et al. | 327/374 |
| 6,177,819 B1 | 1/2001 | Nguyen | 327/112 |
| 6,256,235 B1 | 7/2001 | Lee | 365/189.11 |
| 6,380,770 B1 | 4/2002 | Pasqualini | 327/112 |
| 6,518,794 B2 * | 2/2003 | Coteus et al. | 326/93 |

* cited by examiner

*Primary Examiner*—Linh My Nguyen
(74) *Attorney, Agent, or Firm*—Sterne, Kessler, Goldstein & Fox P.L.L.C.

(57) ABSTRACT

Methods and systems for controlling delay relatively independent of process, supply-voltage, and/or temperature ("PVT") variations include sensing an output signal after a number of inverters and activating different numbers of transistors and/or adjusting strength of transistors in a delay path to compensate for PVT variations. In an embodiment, a waveform is received, delayed, and output to an output terminal using at least one relatively low-power device. Supplemental output power is provided by at least one relatively high-power device until the output waveform exceeds a threshold.

14 Claims, 7 Drawing Sheets

DELAY CIRCUIT AND METHOD WITH DELAY RELATIVELY INDEPENDENT OF PROCESS, VOLTAGE, AND TEMPERATURE VARIATIONS

CROSS REFERENCE TO RELATED APPLICATIONS

This application is a continuation U.S. patent application Ser. No. 10/661,563, filed Sep. 15, 2003 now U.S. Pat. No. 6,815,995, which is a continuation of U.S. patent application Ser. No. 10/180,501, now U.S. Pat. No. 6,646,488, filed Jun. 27, 2002, which claims priority to U.S. Provisional Application No. 60/357,878, filed Feb. 21, 2002, titled "Delay Circuit With Delay Relatively Independent of Process, Voltage, and Temperature Variations," each of which is hereby incorporated herein by reference in its entirety.

BACKGROUND OF THE INVENTION

1. Field of the Invention

The present invention is directed to delay circuits and, more particularly, to delay circuits that are implemented in integrated circuits that are fabricated with reduced feature-size technologies, wherein the delay circuits compensate for process, supply-voltage and/or temperature variations that could otherwise affect the integrated circuits.

2. Background Art

Integrated circuits are fabricated using reduced feature-size technologies, which have significant variations in device characteristics across the process, supply-voltage and temperature (PVT) corners. PVT variations can lead to reduced rise and/or fall times. Reduced rise and/or fall times tend to appear as unexpected delay because the signals do not reach their intended level until later than expected. For extracting maximum benefit from a given process technology, among other things, the delay across various paths of the circuit has to be controlled such that the delay variation across PVT is minimal.

Methods and systems are needed for controlling delay caused by PVT variations.

BRIEF SUMMARY OF THE INVENTION

The present invention is directed to methods and systems that enable control of delay, relatively independent of process, supply-voltage and/or temperature ("PVT") variations. This is made possible by, for example, sensing the output signal after a pre-determined number of inverters and adjusting the gate drive of transistors in the delay path to compensate for PVT variations.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The present invention will be described with reference to the accompanying drawings. The drawing in which an element first appears is typically indicated by the leftmost digit(s) in the corresponding reference number.

DETAILED DESCRIPTION OF THE INVENTION

Overview

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

Figure 1:
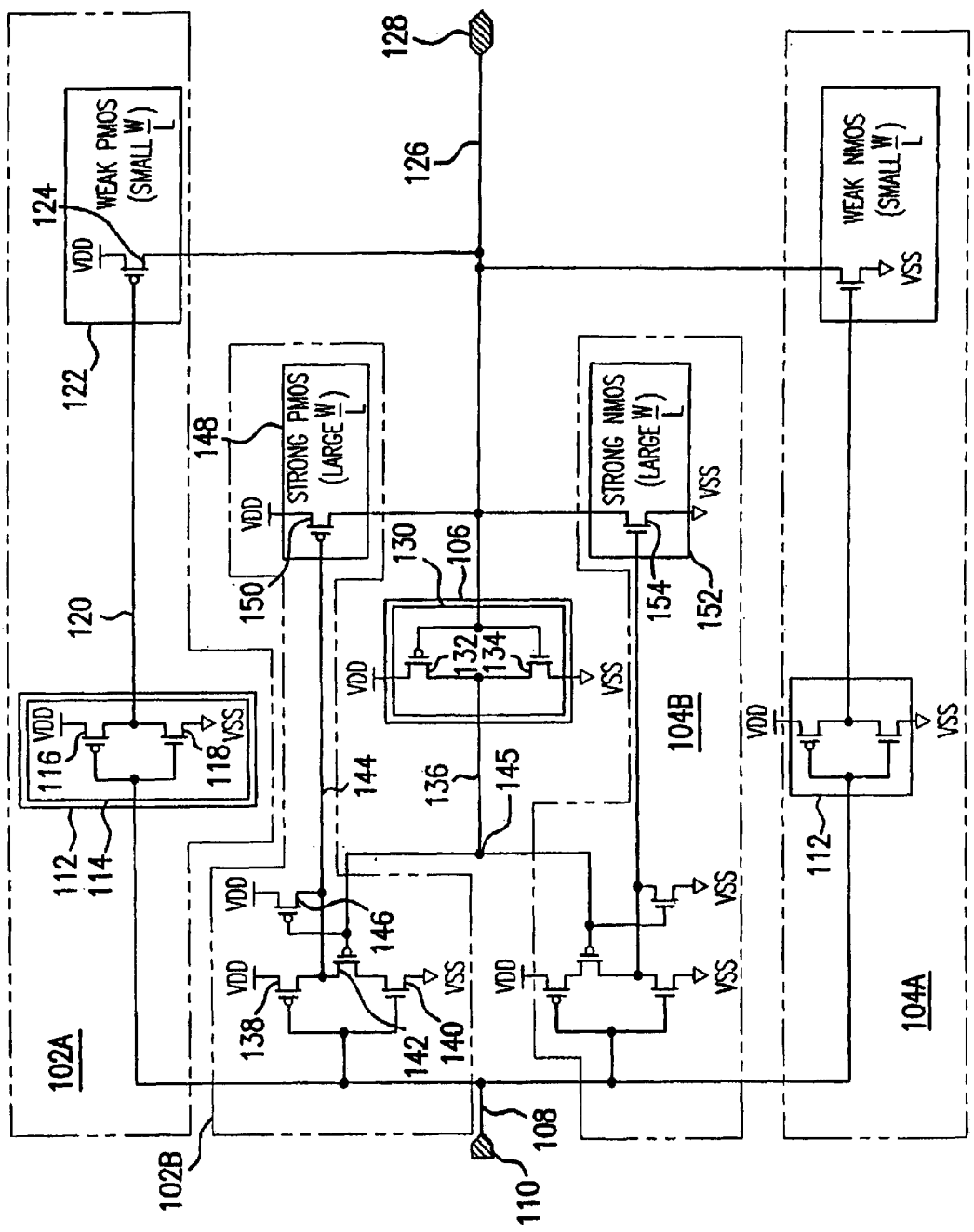
FIG. 1 is a schematic diagram of a delay block in accordance with an aspect of the invention.

FIG. 1 illustrates an example PVT-compensated delay block ("delay block") 100, in accordance with the invention. The delay block 100 includes a rising edge path 102 and a falling edge path 104. The rising edge path 102 processes rising edges of a received waveform 108. The falling edge path 104 processes falling edges of the received waveform 108. In an alternative embodiment only the rising edge path 102 or the falling edge path 104 is implemented.

The rising edge path 102 includes a weak path 102A and a strong path 102B. Similarly, the falling edge path 104 includes a weak path 104A and a strong path 104B. The weak paths 102A and 104A include one or more relatively weak transistors. The strong paths 102B and 104B include one or more relatively strong transistors.

When used herein, the phrases, "weak transistor" and "strong transistor" refer to relative drive capabilities of transistors. Weak transistors are transistors with lower width/length ratios. Strong transistors are transistors with higher width/length ratios. Weak transistors are advantageous because they typically require lower power supply voltage level and typically consume less power than strong transistors. Weak transistors are thus often preferred where power consumption is sought to be minimized. Weak transistors, however, tend to be more susceptible to PVT variations than strong transistors. PVT variations typically result in reduced rise times and/or reduced fall times. Reduced rise and/or fall times tend to appear as increased delay because the waveform does not reach a desired amplitude until later than expected.

The weak paths 102A and 104A receive the input waveform 108 from an input terminal 110. The weak paths 102A and 104A delay the received waveform 108 by a desired amount and output a delayed waveform 126 at an output terminal 128. In the example of FIG. 1, the weak paths 102A and 104A include a series of inverters. The invention is not limited, however, to this example. The weak paths 102A and 104A may include any suitable circuitry that is susceptible to PVT variations.

The strong paths 102B and 104B receive feedback from the weak paths 102A and 104A, respectively. In FIG. 1, a feedback block 106 is coupled between the output terminal 128 and the strong paths 102B and 104B. When feedback indicates that the weak paths 102A and/or 104A are adversely affected by PVT variations, (e.g., reduced rise and/or fall times), the associated strong path 102B and/or strong path 104B provide additional output drive power to correct for the PVT variations. The additional output drive power increases the rise and/or fall times of the delayed waveform, thus compensating for the PVT variations.

Figure 3:
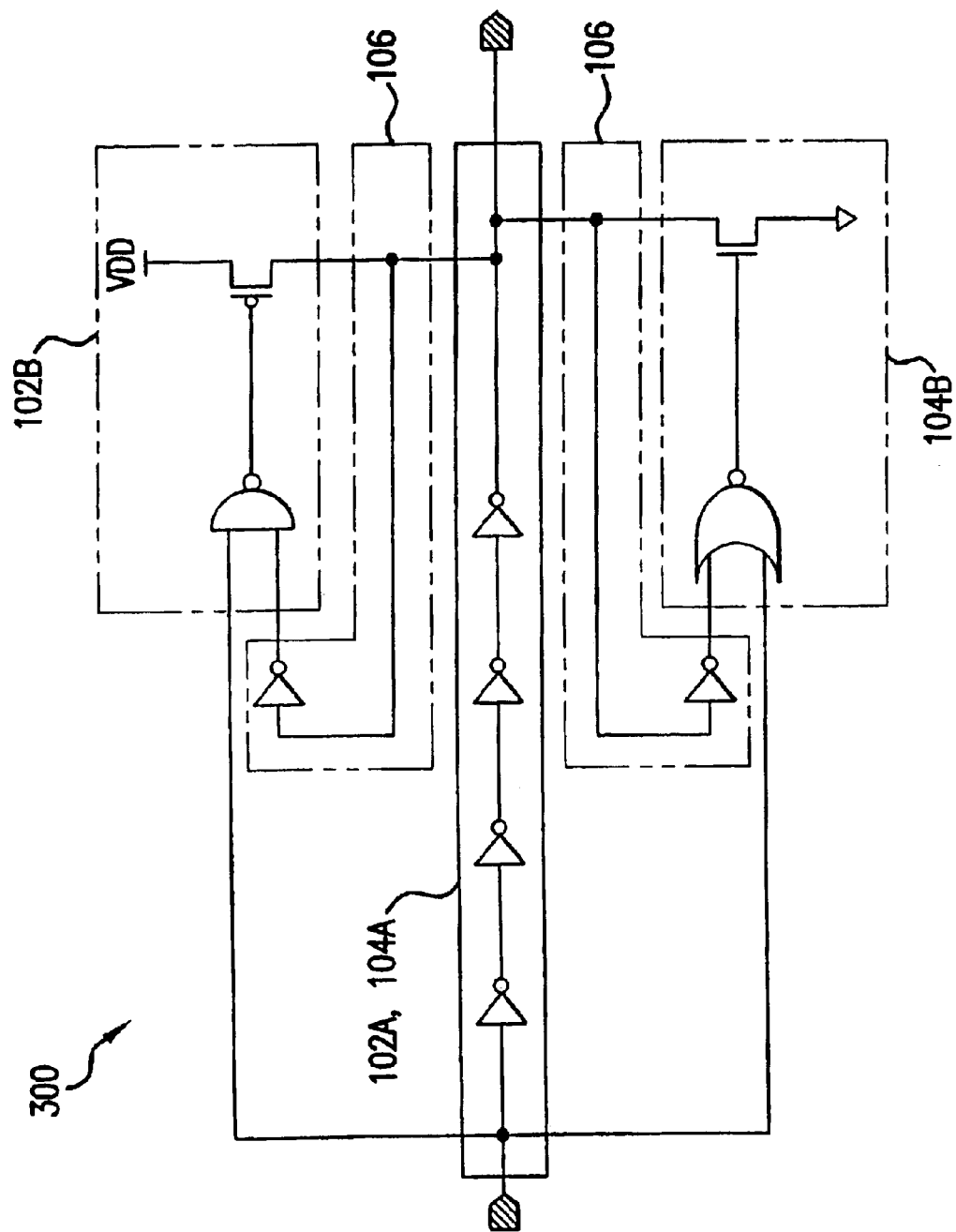
FIG. 3 is a logic diagram of a delay block in accordance with an aspect of the invention.

Functional features of the delay block 100 are illustrated in FIG. 3, with a logic block diagram 300.

Operation of the delay block 100, as illustrated in FIG. 1, is now described. The description begins with rising edge path 102. Within the rising edge path 102, the rising edge weak path 102A includes a circuit element 112 and an output driver 122. The circuit element 112 includes an inverter 114, implemented here with a PMOS device 116 and an NMOS device 118. The inverter 114, has an inherent amount of delay. Additional inverters 114 can be added if desired. The output driver 122 includes a PMOS device 124 which typically includes an additional inherent delay.

The rising edge weak path 102A receives the input waveform 108 from the input terminal 110. The circuit element 112 delays the waveform 108 by some desired amount and outputs an interim delayed waveform 120 to the output driver 122. The PMOS device 124 optionally further delays the interim delayed waveform 120 and outputs the output delayed waveform 126 to the output terminal 128.

Where, as in this example, the circuit element 112 includes an inverter, the interim delayed waveform 120 is an inverted delayed representation of the input waveform 108. The PMOS device 124 inverts the interim delayed form 120 and outputs the output delayed waveform 126.

Where, as in this example, the rising edge weak path 102A includes inverters, an even number of inverters is preferably used. In this way, output delayed waveform 126 will be substantially similar to the input waveform 108, but delayed in time by the inherent delay of the circuit element(s) 112 and the output driver 122.

In accordance with the invention, the output driver 122 and, optionally, the circuit element 112 are implemented with one or more relatively weak transistor devices, meaning devices that consume relatively little power. Under normal operating conditions, as the input waveform 108 rises, the output delayed waveform 126 from the rising edge weak path 102A also rises, but delayed in time by an expected amount of time relative to the input waveform 108. However, when process, supply-voltage, and/or temperature ("PVT") variations adversely affect the relatively weak transistor devices within rising edge weak path 102A, the output delayed waveform 126 will rise and/or fall more slowly than the input waveform 108. This will make the output delayed waveform 126 appear to be delayed more than the expected delay time.

The falling edge weak path 104A operates in a manner similar to the rising edge weak path 102A, taking into account that the rising edge weak paths pulls the output signal 128 up, while the falling edge weak path pulls the output signal 128 down.

In order to compensate for PVT variations, the feedback block 106 senses conditions of the output delayed waveform 126, and controls the strong paths 102B and 104B to provide additional output drive, as needed, to compensate for PVT variations. The feedback block 106 receives the delayed output waveform 126 and outputs a feedback signal 136 to the strong paths 102B and 104B. The feedback block 106 varies the feedback signal 136 in accordance with the level of the output delayed waveform 126.

In the example of FIG. 1, the feedback block 106 includes an inverter 130, implemented as a PMOS device 132 and an NMOS device 134. As the output delayed waveform 126 rises, the feedback signal 136 falls. Conversely, as the output delayed waveform 126 falls, the feedback signal 136 rises. The feedback signal 136 is provided to a node 145, which is coupled to the strong paths 102B and 104B.

In the example of FIG. 1, the rising edge strong path 102B and the falling edge strong path 104B are designed to provide supplemental output drive unless the feedback block 106 disables the strong paths 102B and 104B. The feedback block 106 disables the strong paths 102B and 104B when the output delayed waveform 126 rises or falls within the expected time.

The rising edge strong path 102B is now described. The rising edge strong path 102B includes an output driver 148, implemented here with a PMOS device 150. The PMOS device 150 includes a drain terminal coupled to VDD and a source terminal coupled to the output terminal 128. A gate terminal of the PMOS device 150 is controlled by a voltage at a node 144. The voltage at the node 144 controls the PMOS device 150 as follows. As the voltage at the node 144 falls, the PMOS device 150 turns on, which increasingly couples VDD to the output terminal 128. This increases the current to the output terminal 128. As the voltage at the node 144 rises, the PMOS device 150 turns off, increasingly isolating VDD from the output terminal 128. This decreases the current provided to the output terminal 128.

Control of the voltage at the node 144 is now described. The rising edge strong path 102B further includes PMOS devices 138 and 146, and NMOS devices 140 and 142. Recall that when the output delayed waveform is low, the feedback signal 136 at the node 145 is high. This turns on the NMOS device 142. When the NMOS device 142 turns on, the PMOS device 138 and the NMOS device 140 form an inverter. The PMOS device 138 and the NMOS device 140 include gate terminals coupled to the input terminal 110, which forms the input of the inverter. The inverter formed by the PMOS device 138 and the NMOS device 140 has an inherent delay, so that a delayed, inverted representation of the input waveform 108 appears at the node 144. As the input waveform 108 rises, the output of the inverter, node 144, falls. As described above, this increasingly turns on the PMOS 150, which pulls the output terminal 128 toward VDD. In other words, as the input waveform 108 rises, and when the output delayed waveform 126 is slow to rise relative to the delayed inverter waveform at the node 144, the rising edge strong path 102B pulls up the output terminal 128 toward VDD.

When the level at the output terminal 128 rises, the feedback signal 136 disables the PMOS device 150, as now described. Recall that, as the output waveform 126 rises, the feedback signal 136 falls. As the feedback signal 136 falls, the NMOS device 142 turns off, which isolates the node 144 from the NMOS device 140. This prevents the NMOS device 140 from pulling down the node 144. Furthermore, as the feedback signal 136 falls, it controls a gate terminal of the PMOS device 146 to increasingly couple VDD to the node 144. As the node 144 rises toward VDD, it increasingly turns off the PMOS device 150. This increasingly isolates VDD from the output terminal 128, which reduces the supplemental drive provided to the output terminal 128. At this point, the rising edge weak path driver PMOS device 124 should be able to drive the output delayed waveform 126.

The rising edge weak path 102A and the rising edge strong path 102B are designed with relative delays and transistor thresholds so that, under normal operating conditions, when the input waveform 108 rises, the output delayed waveform 126 rises within a desired delay time. When this occurs, the feedback signal 136 falls quickly enough to couple the node 144 to VDD, disabling the output driver 148 before the input waveform 108 propagates through the NMOS device 140 to the node 144. When, however, the output delayed waveform 126 does not rise within the desired delay time, the input waveform 108 propagates through the NMOS device 140 to the node 144 and turns on the PMOS device 150. The PMOS device 150 remains on until the feedback signal 136 falls in response to the rising output delayed waveform 126, or until the input waveform 108 falls.

When the input signal 108 falls, the PMOS device 150 terminates the output drive from the rising edge strong path 102B as follows. When the input signal 108 falls, the NMOS device 140 turns off, isolating the node 144 from the low potential VSS. Furthermore, as the input signal 108 falls, the PMOS device 138 turns on, coupling the node 144 to VDD, which turns off the PMOS device 150. Thus, as the input signal 108 falls, the output driver 148 terminates the output drive from the rising edge strong path 102B. Similarly, as the input waveform 108 falls, the output of the inverter 114 in rises, turning off the PMOS device 124, thus terminating the output of the rising edge weak path 102A. Furthermore, as the input signal 108 falls, falling edge path 104 pulls the output delayed waveform 126 down to the potential of VSS in a similar fashion to the rising edge path 102, as will be apparent to one skilled in the relevant art(s) based on the description herein.

The present invention thus allows use of reduced feature-size technologies for normal operation, while providing back-up circuitry to provide compensation as needed, such as for PVT variations.

Figure 2:
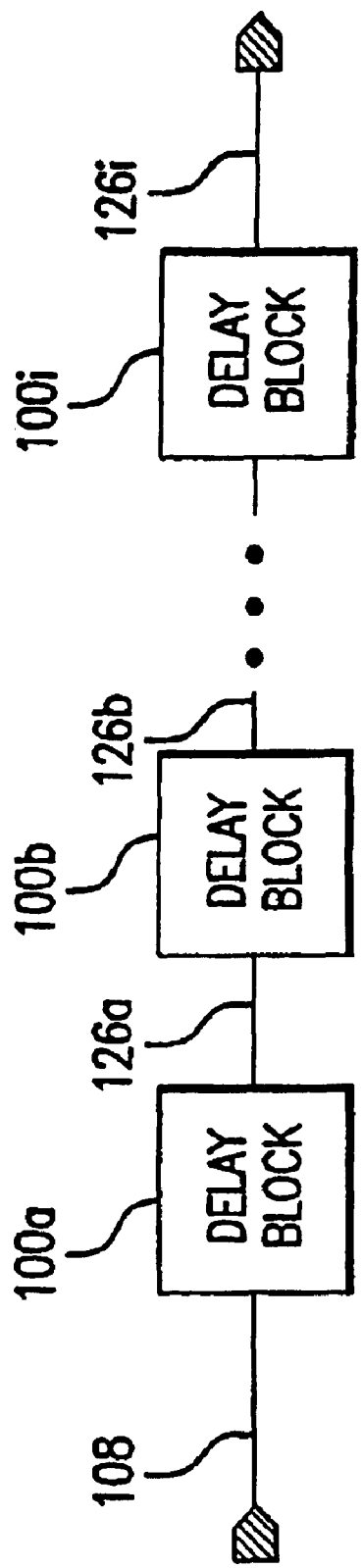
FIG. 2 is a block diagram of a series of delay blocks, in accordance with an aspect of the invention.

FIG. 2 is a block diagram of multiple delay blocks 100 coupled in series to obtain a desired overall delay. A first delay block 100A receives the waveform 108 and outputs a delayed waveform 126a, substantially as described above with respect to FIG. 1. A second delay block 100B receives the outputted delayed waveform 126a and delays it further and outputs delayed waveform 126b. This is repeated by subsequent delay blocks through to delay block 100i, which outputs a final output delayed waveform 126i.

Figure 4:
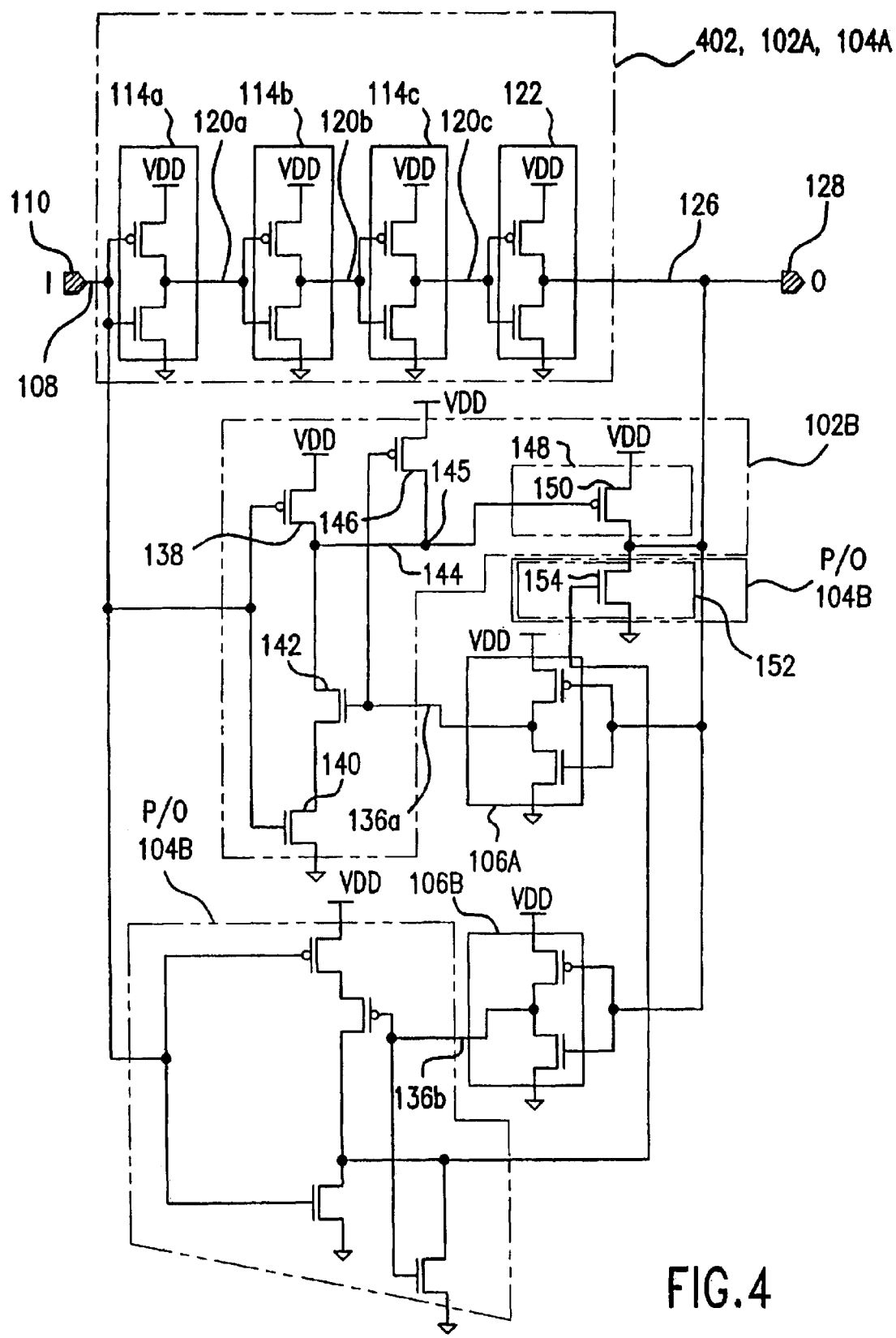
FIG. 4 is a schematic diagram of another delay block in accordance with an aspect of the invention.

FIG. 4 illustrates another example embodiment of the delay block 100. In this example, the rising edge weak path 102a and the falling edge weak path 104a are integrated into a single weak path 402, while the feedback block 106 is implemented with a rising edge feedback block 106a and a falling edge feedback block 106b. The weak path 402 includes multiple circuit elements 112, illustrated here as inverters 114a–114c, and inverting output driver 122. In this embodiment, the inverter 114a is referred to as an initial delay element, and the inverting output driver 122 is referred to as a final delay element. Operation of the delay block 100 illustrated in FIG. 4 is substantially similar to operation of the delay block 100 illustrated in FIG. 1.

In accordance with the invention, one or more of the devices within the weak paths 102A, 104A, and 402 are relatively weak devices, and one or more of the devices within the strong paths 102B, 104B are relatively strong devices. In the example of FIG. 4, and without limitation, the weak path 402 includes a PMOS device 410 implemented with widths of approximately 0.93 microns and lengths of approximately 0.39 microns, and an NMOS device 418 implemented with widths of approximately 0.49 microns and lengths of approximately 0.39 microns. Within the rising edge strong path 102B, the PMOS device 150 is implemented with widths of approximately 0.93 microns and lengths of approximately 0.13 microns. Within the falling edge strong path 104B, the NMOS device 152 is implemented with widths of approximately 0.49 microns and lengths of approximately 0.13 microns. The invention is not, however, limited to these examples. Based on the description herein, one skilled in the relevant art(s) will understand that other widths, lengths, and/or width/length ratios can be implemented as well.

Figure 5:
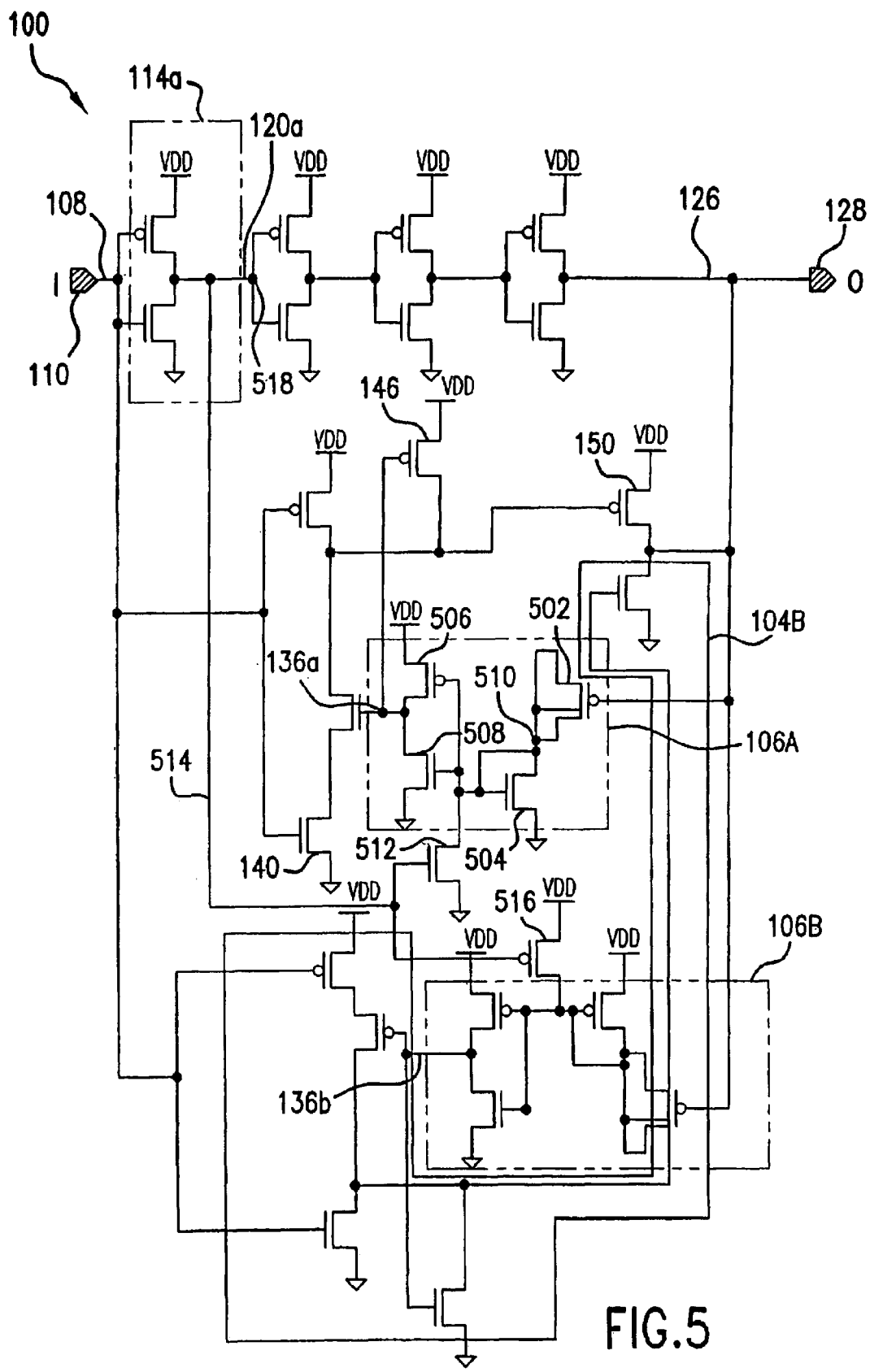
FIG. 5 is a schematic diagram of another delay block in accordance with an aspect of the invention.

FIG. 5 illustrates another example embodiment of the delay block 100, wherein the feedback blocks 106A and 106B are designed to sense current at the output terminal 128. In previous drawing figures, the feedback block 106 was designed to sense primarily voltage levels at the output terminal 128.

In FIG. 5, feedback block 106A includes a PMOS device 502, configured as a capacitor, and an NMOS device 504 configured as a diode. As the output delayed waveform 126 voltage increases with time (dV/dt), a current flows from a gate of the PMOS device 502 to a node 510. This current flows through diode connected NMOS device 504 to a relatively low potential, illustrated here as ground. The current flow through the diode connected NMOS device 504 generates a voltage at the node 510, proportional to the dV/dt of the output delayed waveform 126.

The feedback block 106A further includes an inverter formed by a PMOS device 506 and an NMOS device 508. The inverter inverts the signal at the node 510 and outputs the inverted signal at a node 136a. In operation, when the dV/dt of the output delayed waveform 126 is sufficiently high, the voltage at the node 510 increases. As the voltage at the node 510 increases, the voltage at the node 136a decreases. As the voltage at the node 136a decreases, the PMOS device 146 increasingly turns on, which turns off the output driver PMOS device 150. In other words, when the output delayed waveform 126 rises at or greater than a desired dV/dt, the output driver 150 does not provide supplemental output drive.

Another way of analyzing the operation of the feedback block 106A is to consider the current flow. The NMOS device 504 forms a current mirror with the NMOS device 508. The width/length ratios of the NMOS devices 504 and 508 determine the current ratio between the NMOS devices 504 and 508. As the current through the NMOS device 508 increases, it pulls down the node 136a.

An optional enable/disable feature is provided by a line 514 coupled between an output of the first inverter 114a and a gate terminal of an NMOS device 512. When the input waveform 110 falls, the output of the first inverter 114a rises. This turns on the NMOS device 512, which couples the node 510 to ground. This turns on the PMOS device 506, which couples the node 136a to VDD. This turns off the PMOS device 146, which effectively prevents the feedback block 106A from disabling the PMOS device 150.

The falling edge feedback block 106B operates in a similar fashion to the rising edge feedback block 106A, taking into account that the falling edge strong path 104B pulls the output terminal 128 down when the input waveform 108 falls.

Figure 6:
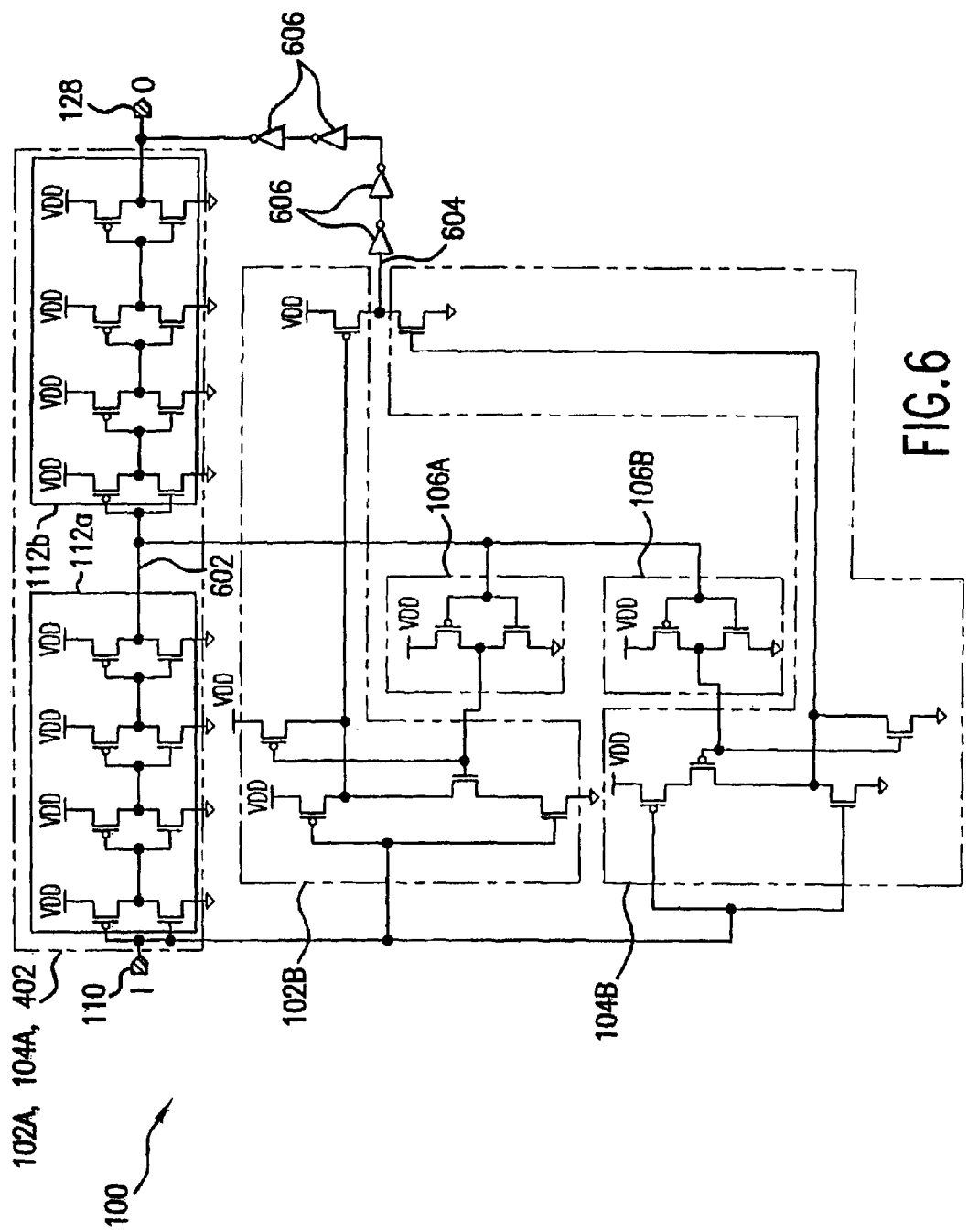
FIG. 6 is a schematic diagram of another delay block in accordance with an aspect of the invention.

FIG. 6 illustrates another example implementation of the delay block 100, wherein the delay block 100 includes multiple circuit elements 112a, 112b, and wherein the feedback block receives feedback from a point prior to the output terminal 128. In the example of FIG. 6, the feedback blocks 106A and 106B receive an interim delayed waveform 602 from the circuit element 112a. Where the feedback blocks 106A and 106B receive an interim delayed waveform 602 from a subsequent circuit element 112, additional delay circuitry can be included in the feedback blocks 106A and 106B, and/or in the strong paths 102A and 102B, to compensate for the additional delay encountered in the subsequent circuit elements 112. The rising edge strong path 102B and the falling edge strong path 104B provide compensation 604 to the output terminal 128, substantially as described above. Delay in subsequent delay elements, illustrated here as circuit element 112B, can be accounted for with one or more compensation-path delay elements 606.

An advantage of the delay block 100 illustrated in FIG. 6 is that the single set of feedback blocks 106A and 106B, and a single set of rising edge strong path 102B and falling edge strong path 104B are required for a plurality of circuit elements 112. One or more of the delay blocks 100 illustrated in FIG. 2 can be implemented as illustrated in FIG. 6.

Figure 7:
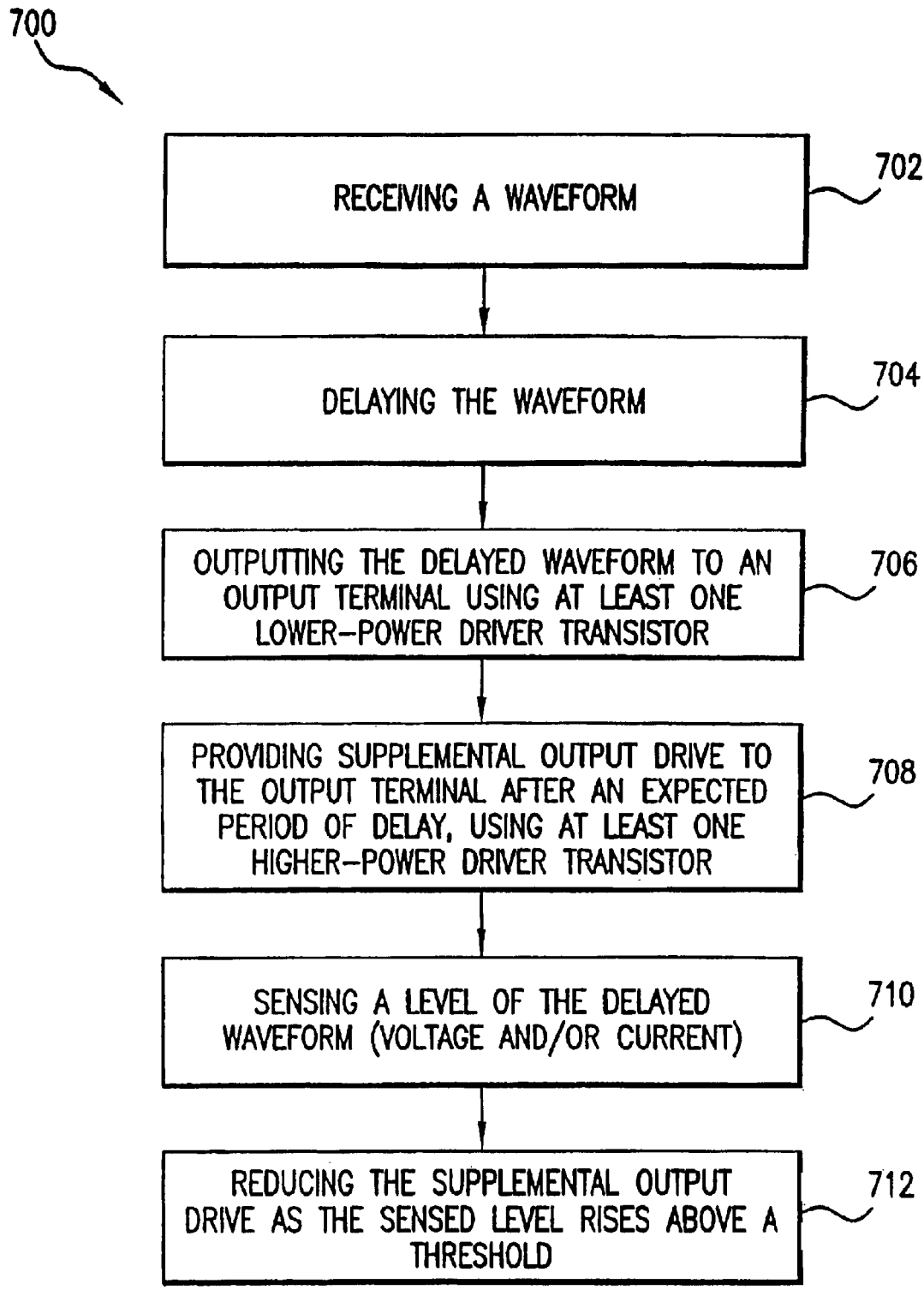
FIG. 7 is an example process flowchart for compensating for PVT variations, in accordance with an aspect of the invention.

FIG. 7 illustrates a process flowchart 700 in accordance with an aspect of the invention. The process flowchart 700 is described with reference to the example delay block 100 illustrated in FIGS. 1 through 6. The process flowchart 700 is not, however, limited to the example output block 100 illustrated in FIGS. 1 through 6. Based on the description herein, one skilled in the relevant art(s) will understand that the process flowchart 700 can be implemented with other circuits as well. Such other implementations are within the spirit and scope of the present invention.

The process begins at step 702, which includes, receiving a waveform. In the example of FIG. 1, the waveform 108 is received at the input terminal 110.

Step 704 includes delaying the waveform. In the example of FIG. 1, rising edges of the waveform 108 are delayed by the circuit element 112 in the rising edge weak path 102A, which outputs the delayed waveform 120. Falling edges of the waveform 108 are delayed by the circuit element 112 in the falling edge weak path 104A.

Step 706 includes outputting the delayed waveform to an output terminal using at least one lower-power driver transistor. In the example of FIG. 1, the PMOS device 124 outputs rising edges of the delayed waveform 108 as an output delayed signal 126 to the output terminal 128. Falling edges of the delayed waveform 108 are output to the output terminal 128 by the falling edge weak path 104A. The invention is not, however, limited to this example embodiment.

Step 708 includes providing supplemental output drive to the output terminal after an expected period of delay, using at least one higher-power driver transistor. In the example of FIG. 1, supplemental output drive is provided by the strong paths 102B and 104B, after an inherent delay of the strong paths 102B and 104B. The invention is not, however, limited to this example embodiment.

Step 710 includes sensing a level of the delayed waveform. Step 710 can be performed by sensing voltage and/or current levels. In the examples of FIGS. 1, 4, and 6, the feedback block 106 senses primarily voltage levels. In the example of FIG. 5, the feedback block 106 senses primarily current levels.

Step 712 includes reducing the supplemental output drive as the sensed level rises above a threshold. In the example of FIG. 1, the feedback block 106 disables the output drivers in the strong paths 102B and 104B when the output delayed signal 106 rises above a threshold. For example, the feedback block 106 disables the PMOS device 150 when the output delayed signal 106 causes the feedback signal 136 to fall low enough to turn on the PMOS device 146, as described above.

Steps 704–712 are performed for rising edge and falling edge portions of the received waveform, as illustrated in FIGS. 1–6. Steps(1) through (5) can be repeated using the first output delayed signal as a second input signal, thereby further delaying the received waveform while compensating for PVT variations, as illustrated in FIG. 2.

The process flowchart 700 can be implemented to delay a received waveform with multiple delay operations, as illustrated, for example, in FIG. 6. In this embodiment, step 704 includes performing a plurality of serial delay operations, including at least one initial delay operation and a final delay operation, on the received waveform. Step 708 includes providing supplemental output drive to the output terminal through one or more compensation-path delay elements, as illustrated by the compensation-path delay elements 606 in FIG. 6. Step 710 includes sensing a level of the delayed waveform output from one of the initial delay operations, as illustrated in FIG. 6.

The present invention has been described above with the aid of functional building blocks illustrating the performance of specified functions and relationships thereof. The boundaries of these functional building blocks have been arbitrarily defined herein for the convenience of the description. Alternate boundaries can be defined so long as the specified functions and relationships thereof are appropriately performed. Any such alternate boundaries are thus within the scope and spirit of the claimed invention. One skilled in the art will recognize that these functional building blocks can be implemented by discrete components, application specific integrated circuits, processors executing appropriate software and the like or any combination thereof.

When used herein, the terms "connected" and/or "coupled" are generally used to refer to electrical connections. Such electrical connections can be direct electrical connections with no intervening components, and/or indirect electrical connections through one or more components.

While various embodiments of the present invention have been described above, it should be under-stood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A method for controlling delay over process, supply-voltage, and temperature variations, comprising:
    (a) receiving a waveform;
    (b) delaying said waveform;
    (c) outputting said delayed waveform to an output terminal using at least one relatively low-power driver transistor;
    (d) providing supplemental output drive to said output terminal after an expected period of delay, using at least one relatively high-power driver transistor;
    (e) sensing a level of said delayed waveform; and
    (f) disabling said at least one high-power driver transistor when the output delayed signal exceeds a threshold.

2. The method of claim 1, wherein said steps (a) through (e) are performed for rising edge and falling edge portions of the received waveform.

3. The method of claim 1, further comprising repeating said steps (a) through (e) using the first output delayed signal as a second input signal, thereby further delaying the received waveform while compensating for process, supply-voltage, and temperature variations.

4. An apparatus for controlling delay over process, supply voltage, and temperature variations, comprising:
- an input terminal;
- an output terminal;
- a first path coupled between the input terminal and the output terminal, the first path including at least one relatively low-power output driver transistor that outputs a delayed representation of a received waveform to the output terminal;
- a second path coupled between the input terminal and the output terminal, the second path including at least one relatively high-power rising edge output driver transistor that outputs a delayed representation of a rising edge of a received waveform to the output terminal;
- a third path coupled between the input terminal and the output terminal, the third path including at least one relatively high-power falling edge output driver transistor that outputs a delayed representation of a falling edge of a received waveform to the output terminal; and
- a feedback path including a sensing circuit coupled to an output of the first path, the feedback path including an output coupled to the second path and the third path, wherein the feedback path outputs a feedback signal to the second path and the third path that increasingly disables at least one of the relatively high-power output driver transistors as the waveform output from the first path exceeds a threshold.

5. The apparatus of claim 4, wherein the at least one relatively low-power output driver transistor includes at least one PMOS transistor and at least one NMOS transistor.

6. The apparatus of claim 5, wherein the at least one PMOS transistor has a width of approximately 0.93 microns and a length of approximately 0.39 microns, and wherein the at least one NMOS transistor has a width of approximately 0.49 microns and a length of approximately 0.39 microns.

7. The apparatus of claim 4, wherein the at least one relatively high-power rising edge output driver transistor includes at least one PMOS transistor.

8. The apparatus of claim 7, wherein the at least one PMOS transistor has a width of approximately 0.93 microns and a length of approximately 0.13 microns.

9. The apparatus of claim 4, wherein the at least one relatively high-power falling edge output driver transistor includes at least one NMOS transistor.

10. The apparatus of claim 9, wherein the at least one NMOS transistor has a width of approximately 0.49 microns and a length of approximately 0.13 microns.

11. The apparatus of claim 4, wherein said sensing circuit senses a voltage level.

12. The apparatus of claim 11, wherein said sensing circuit comprises an inverter.

13. The apparatus of claim 4, wherein said sensing circuit senses a current level.

14. The apparatus of claim 13, wherein said sensing circuit comprises a capacitor.

* * * * *